United States Patent
Someya

(10) Patent No.: US 8,131,237 B2
(45) Date of Patent: Mar. 6, 2012

(54) RADIO WAVE RECEIVING APPARATUS

(75) Inventor: Kaoru Someya, Kiyose (JP)

(73) Assignee: Casio Computer Co., Ltd., Tokyo (JP)

( * ) Notice: Subject to any disclaimer, the term of this patent is extended or adjusted under 35 U.S.C. 154(b) by 156 days.

(21) Appl. No.: 12/486,212

(22) Filed: Jun. 17, 2009

(65) Prior Publication Data

US 2009/0318102 A1  Dec. 24, 2009

(30) Foreign Application Priority Data

Jun. 24, 2008  (JP) .................................. 2008-163953
Apr. 23, 2009  (JP) .................................. 2009-105435

(51) Int. Cl.
*H04B 1/18*  (2006.01)

(52) U.S. Cl. ............... 455/193.1; 455/193.2; 455/193.3; 455/182.1; 455/182.2; 455/182.3; 455/191.1; 455/192.1; 455/192.3; 375/222; 375/257

(58) Field of Classification Search .................. 455/307, 455/296, 190, 179.1, 192.1, 191.1–191.3, 455/182.1–182.3, 193.1, 193.2, 193.3, 192.3; 333/17.1; 375/222, 257
See application file for complete search history.

(56) References Cited

U.S. PATENT DOCUMENTS

| | | | | | |
|---|---|---|---|---|---|
| 4,100,578 | A | * | 7/1978 | Arneson | 455/182.3 |
| 4,326,220 | A | * | 4/1982 | Mogi | 348/731 |
| 6,177,846 | B1 | | 1/2001 | Takada et al. | |
| 6,535,075 | B2 | * | 3/2003 | Frech et al. | 333/17.1 |
| 6,681,102 | B1 | * | 1/2004 | Collier et al. | 455/296 |
| 6,750,734 | B2 | * | 6/2004 | Utsunomiya et al. | 333/17.1 |
| 7,155,186 | B2 | * | 12/2006 | Kasperkovitz | 455/234.1 |
| 7,251,466 | B2 | * | 7/2007 | Porret et al. | 455/190.1 |
| 7,756,500 | B1 | * | 7/2010 | Fulga et al. | 455/266 |
| 7,860,477 | B2 | * | 12/2010 | Christ | 455/307 |
| 2004/0137865 | A1 | * | 7/2004 | Callias et al. | 455/179.1 |

FOREIGN PATENT DOCUMENTS

JP  11-312959 A  11/1999
JP  2000-231609 A  8/2000

* cited by examiner

*Primary Examiner* — Junpeng Chen
(74) *Attorney, Agent, or Firm* — Holtz, Holtz, Goodman & Chick, PC

(57) ABSTRACT

Disclosed is a radio wave receiving apparatus including: an antenna to receive a radio wave; a tuning member to allow a reception frequency of the antenna to be tuned to an intended frequency, in which tuning member a frequency characteristic is variable; a receiving member to receive a reception signal from the antenna to demodulate a modulation wave; a positive feedback member to perform a positive feedback in a signal path including the tuning member; and a switching member to turn on/off a feedback operation of the positive feedback member.

6 Claims, 9 Drawing Sheets

RADIO WAVE RECEIVING APPARATUS

CROSS-REFERENCE TO RELATED APPLICATIONS

This application is based upon and claims the benefit of priority from the prior Japanese Patent Application No. 2008-163953, filed on Jun. 24, 2008, and the prior Japanese Patent Application No. 2009-105435, filed on Apr. 23, 2009, the entire contents of which are incorporated herein by reference.

BACKGROUND OF THE INVENTION

1. Field of the Invention

The present invention relates to a radio wave receiving apparatus equipped with an antenna and a tuning member.

2. Description of Related Art

There has conventionally been a communication apparatus which automatically adjusts a frequency characteristics of a tuning circuit connected to an antenna so as to highly efficiently transmit/receive a radio wave signal of a predetermined frequency (for example, Japanese Patent Application Laid-Open Publication No. 2000-231609, and U.S. Pat. No. 6,177,846).

When adjusting the tuning circuit at the time of receiving in such communication apparatus, it is necessary to perform tuning processing while receiving actual transmission radio wave, or to prepare an oscillator for generating a signal of same frequency as that of actual transmission radio wave to perform tuning processing while receiving the signal from the oscillator. In the tuning processing, the tuning circuit is adjusted so that a signal level of a detected output becomes maximum or that an AGC (Auto Gain Control) signal becomes a minimum gain control, by changing capacitance value of the tuning circuit while monitoring the signal level of the detected output obtained by receiving processing or the AGC signal.

In addition, Japanese Patent Application Laid-Open Publication No. 2000-231609 discloses a technique to adjust the tuning circuit by changing the capacitance value while a transmission circuit operates and compare signal phases of both antenna terminals so that transmission radio wave becomes strongest, as automatic adjusting processing of the tuning circuit when transmitting radio wave.

When adopting a system which receives actual transmission radio wave for performing the tuning processing in order to automatically adjust the tuning circuit in the radio wave receiving apparatus, there is a problem that the automatic adjustment of the tuning circuit can not be normally performed if the tuning circuit does not exist in the environment that the transmission radio wave can be successfully received.

On the other hand, in a system which generates pseudo transmission radio wave by an oscillation circuit and performs the tuning processing while receiving the transmission radio wave, there is a problem that the oscillation circuit accurately oscillating at same frequency as that of the transmission radio wave needs to be prepared individually. When the oscillation circuit is provided inside the receiving apparatus, because a crystal oscillator or the like needs to be used for obtaining an accurate oscillation frequency, even if the reception circuit and the like are integrated, it is difficult to mount all of the oscillation circuit on the integrated circuit. In addition, a configuration which uses a Phase Locked Loop (PLL) circuit to generate an oscillation signal of a predetermined frequency from a reference clock of the integrated circuit may be applied, but a problem that also this configuration needs to prepare an oscillation circuit individually would remain.

SUMMARY OF THE INVENTION

An object of the present invention is to provide a radio wave receiving apparatus capable of performing tuning processing of an antenna only by adding a simple circuit without providing an accurate oscillation circuit.

According to a first aspect of the present invention, there is provided a radio wave receiving apparatus including: an antenna to receive a radio wave; a tuning member to allow a reception frequency of the antenna to be tuned to an intended frequency, in which tuning member a frequency characteristic is variable; a receiving member to receive a reception signal from the antenna to demodulate a modulation wave; a positive feedback member to perform a positive feedback in a signal path including the tuning member; and a switching member to turn on/off a feedback operation of the positive feedback member.

According to a second aspect of the present invention, there is provided a radio wave receiving apparatus including: an antenna to receive a radio wave; a frequency adjusting member to adjust a frequency characteristic of the antenna; a receiving member to receive a reception signal from the antenna to extract an information signal; a feedback member to allow the reception signal output from the antenna to be fed back for oscillation; a radiating antenna to radiate the reception signal fed back by the feedback member as a radio wave; a switching member to switch the feedback member between an operating status and a non-operating status.

BRIEF DESCRIPTION OF THE DRAWINGS

The present invention will sufficiently be understood by the following detailed description and accompanying drawing, but they are provided for illustration only, and not for limiting the scope of the invention.

DETAILED DESCRIPTION OF THE PREFERRED EMBODIMENTS

In the following, the embodiment of the present invention will be described with reference to the drawings.

First Embodiment

Figure 1:
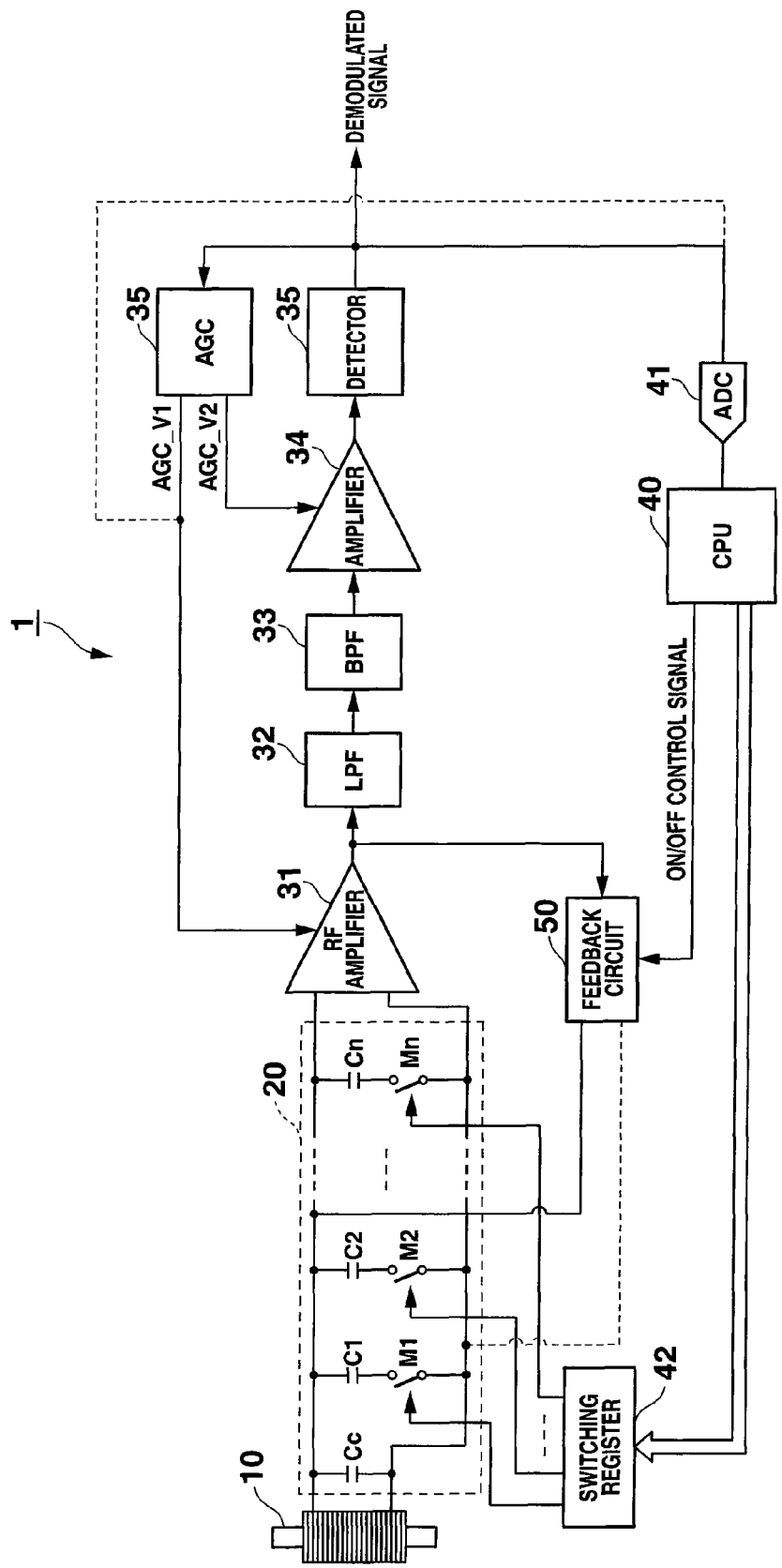
FIG. 1 is a configuration diagram showing a whole radio wave receiving apparatus according to the embodiment of the present invention.

FIG. 1 is a configuration diagram showing a whole radio wave receiving apparatus according to the first embodiment of the present invention.

The radio wave receiving apparatus 1 of the embodiment is an apparatus which receives radio wave within a predetermined frequency band and detects a modulation wave included in the radio wave to demodulate it. For example, the radio wave receiving apparatus 1 may be applied to a radio wave clock and the like as a reception circuit which receives standard radio wave of 60 kHz to demodulate a time code by which carrier wave of the standard radio wave is amplitude modulated.

The radio wave receiving apparatus 1 is equipped with: an antenna 10; a tuning circuit 20 to allow a reception frequency of the antenna 10 to be tuned to an intended frequency; an RF amplifier 31 to amplify the reception signal; a low pass filter 32 and band pass filter 33 which extract a signal within a reception frequency band from the reception signal; an amplifier 34 to amplify the signal which has passed through the filters 32, 33; a detector 35 to detect the modulation wave from the reception signal; an AGC (Auto Gain Control) circuit 36 to control gains of the RF amplifier 31 and the amplifier 34 so that a signal level of the detected signal is stabilized; a feedback circuit 50 to allow an output of the RF amplifier 31 to positively feedback to a signal path including the tuning circuit 20; a Central Processing Unit (CPU) 40 to perform operation control of the feedback circuit 50, setting processing of the tuning circuit 20, and so on; an AD converter 41 to digitalize the detected signal to transmit the digitalized signal to the CPU 40; a switching register 42 in which a setting status of the tuning circuit 20 is written, and so on.

The antenna 10 is a coil antenna where wiring wire is formed around a core, for example.

The tuning circuit 20 is equipped with, for example, a plurality of capacitative elements Cc, C1-Cn capable of being connected in parallel with each other between both terminals of the antenna 10; and a plurality of switching elements M1-Mn to switch connection/cutting of the plurality of capacitative elements Cc, C1-Cn. The reception frequency of the antenna 10 is adjusted by on/off control of the switching elements M1-Mn according to proper combinations thereof to change a capacitance value of the tuning circuit 20 so that high reception intensity can be obtained at a tuning frequency of the circuit coupled with an inductance of the antenna 10.

The switching register 42 is a register in which status values representing on/off of the plurality of the switch elements M1-Mn are set by the CPU 40. The switching register 42 outputs an on/off control signal according to the status value into each of the switch elements M1-Mn so as to actually switch a connection status of the switch elements M1-Mn.

The low pass filter 32 and the band pass filter 33 are designed so that only very narrow band signal including a predetermined frequency band (for example, 60 kHz band) among the reception signal may pass through the filters 32, 33.

The AGC circuit 36 outputs gain control voltages AGC_V1, AGC_V2 to the RF amplifier 31 and the amplifier 34, and automatically controls gains of the amplifier 31, 34 so that amplitude of the detected signal is stabilized. Specifically, the AGC circuit 36 rectifies an output of the detector 35, smoothes the output with a circuit whose time constant is large, and compares a level of the smoothed signal with a reference voltage. Then, the AGC circuit 36 generates and outputs the gain control voltages AGC_V1, AGC_V2 which are proportional to the difference voltage, and thereby amplitude of the output of the detector 35 becomes constant.

The CPU 40 is capable of, for example, sampling and taking in the output of the detector 35 through the AD converter 41, and calculating the signal amplitude of the detected signal or an S/N ratio from the sampling data to judge fine/poor of a reception status and intensity of the reception signal. Moreover, as shown in FIG. 1 by a dotted line, the CPU 40 may be configured to sample and take in the output (the gain control voltages AGC_V1, AGC_V2 and the like) of the AGC circuit 36 through the AD converter 41. The intensity of the reception signal can be judged from also the gain control voltages AGC_V1, AGC_V2. Furthermore, the CPU 40 is configured to perform after-mentioned control program (FIG. 6) for automatic tuning processing.

Figure 2:
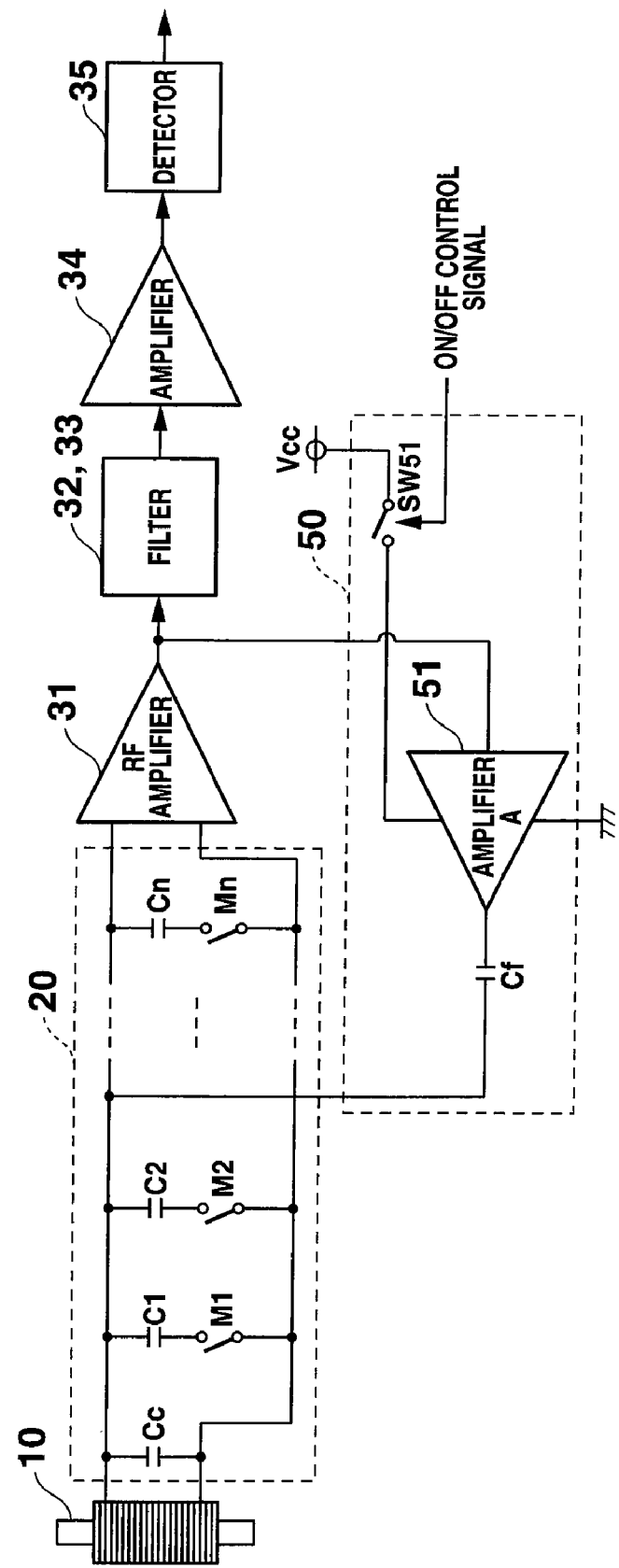
FIG. 2 is a configuration diagram showing an example of details of a feedback circuit.

FIG. 2 shows a configuration diagram of the radio wave receiving apparatus, representing details of the feedback circuit 50.

As shown in FIG. 2, the feedback circuit 50 is composed of: a non-inverting amplifier 51 to receive the output of the RF amplifier 31 to amplify it; a coupling capacitor Cf to couple an output terminal of the non-inverting amplifier 51 and a signal line on a positive electrode side of the tuning circuit 20; a switching element SW51 to switch operating/non-operating of the non-inverting amplifier 51 by on/off power supply thereof, and so on.

The coupling capacitor Cf is an impedance element for coupling the feedback circuit 50 to the signal line for feeding back the signal at small coupling degree, and set as a capacitor with smaller capacity than capacities Cc, C1-Cn of the tuning circuit 20. By setting a value of the coupling capacitor Cf so that an impedance value becomes large, the tuning circuit 20 is not influenced by the feedback circuit 50 when the feedback circuit 50 is in the status of non-operating, and an oscillation frequency of an oscillation by the feedback circuit 50 is hardly influenced by the coupling capacitor Cf. Incidentally, a resistance element having large resistance value may be used instead of the coupling capacitor Cf, as long as the coupling degree can be weak.

The non-inverting amplifier 51 amplifies the feedback signal to compensate it, because the signal to be fed back into the signal line of the tuning circuit 20 becomes small due to the intervening coupling capacitor Cf. The non-inverting amplifier 51 is configured to be supplied with a power supply voltage Vcc to perform signal amplifying when the switch element SW51 is turned on, and to stop the amplifying operation when the switching element SW51 is turned off by cutting off the power supply voltage Vcc, according to the ON/OFF control signal from the CPU 40.

According to such configuration, when the switch element SW51 is turned on and the non-inverting amplifier 51 operates, the signal from the RF amplifier 31 is amplified in the non-inverting amplifier 51, and the amplified signal is fed back to the signal line on the positive electrode side of the tuning circuit 20 through the coupling capacitor Cf whose coupling degree is small. The feedback signal delays by the capacity of the tuning circuit 20 and a time constant depending on the inductance of the antenna 10, and thereby the signal oscillates at almost same frequency as a tuning frequency of the tuning circuit 20.

On the other hand, when the switch element SW51 is turned off and the non-inverting amplifier 51 becomes non-operating, because the coupling degree of the coupling capacitor Cf is very small, an influence of the feedback circuit 50 on receiving operation does not almost occur.

Incidentally, various modifications of the configuration of the feedback circuit 50 are possible. Here, a first to third variations of the feedback circuit 50 will be explained.

[First Variation]

Figure 3:
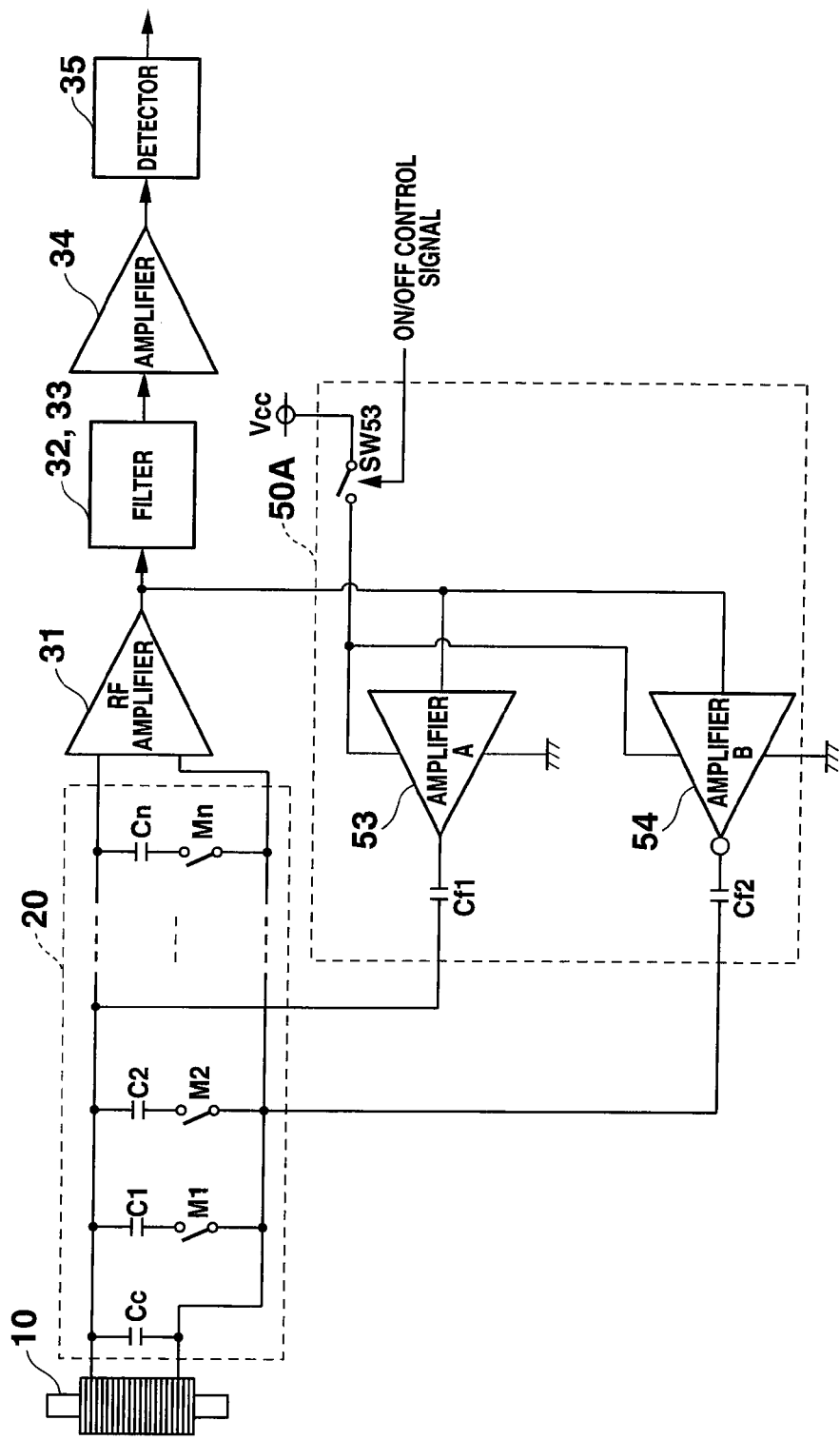
FIG. 3 is a configuration circuit of the radio wave receiving apparatus showing a first variation of the feedback circuit.

FIG. 3 shows a configuration diagram of the radio wave receiving apparatus showing the first variation.

The first variation shown in FIG. 3 is an example where a configuration of a balanced type is applied as the feedback circuit 50A. That is, the feedback circuit 50A is equipped with a non-inverting amplifier 53 and a coupling capacitor Cf1 which feed back the output of the RF amplifier 31 to the signal line on the positive electrode side of the tuning circuit 20, and an inverting amplifier 54 and a coupling capacitor Cf2 which feed back the output of the RF amplifier 31 to the signal line on the negative electrode side of the tuning circuit 20.

The non-inverting amplifier 53 and the coupling capacitor Cf1 have almost same configurations as the non-inverting amplifier 51 and the coupling capacitor Cf shown in FIG. 2. The inverting amplifier 54 and the coupling capacitor Cf2 on the other side have almost same characteristics as the above-mentioned non-inverting amplifier 53 and coupling capacitor Cf1, except that they invert a polar character of the output signal.

Furthermore, when the switch element SW53 is turned on by the ON/OFF control signal from the CPU40, the non-inverting amplifier 53 and the inverting amplifier 54 operate to feed back the signal, and when the switch element SW53 is turned off, the non-inverting amplifier 53 and the inverting amplifier 54 become non-operating state to stop the feedback of the signal.

According to such configuration of the feedback circuit 50A, the feedback of the signal suitable for the case that the antenna 10 and the tuning circuit 20 are the balanced type is performed, and thereby the oscillation can occur at the frequency near the tuning frequency.

[Second Variation]

Figure 4:
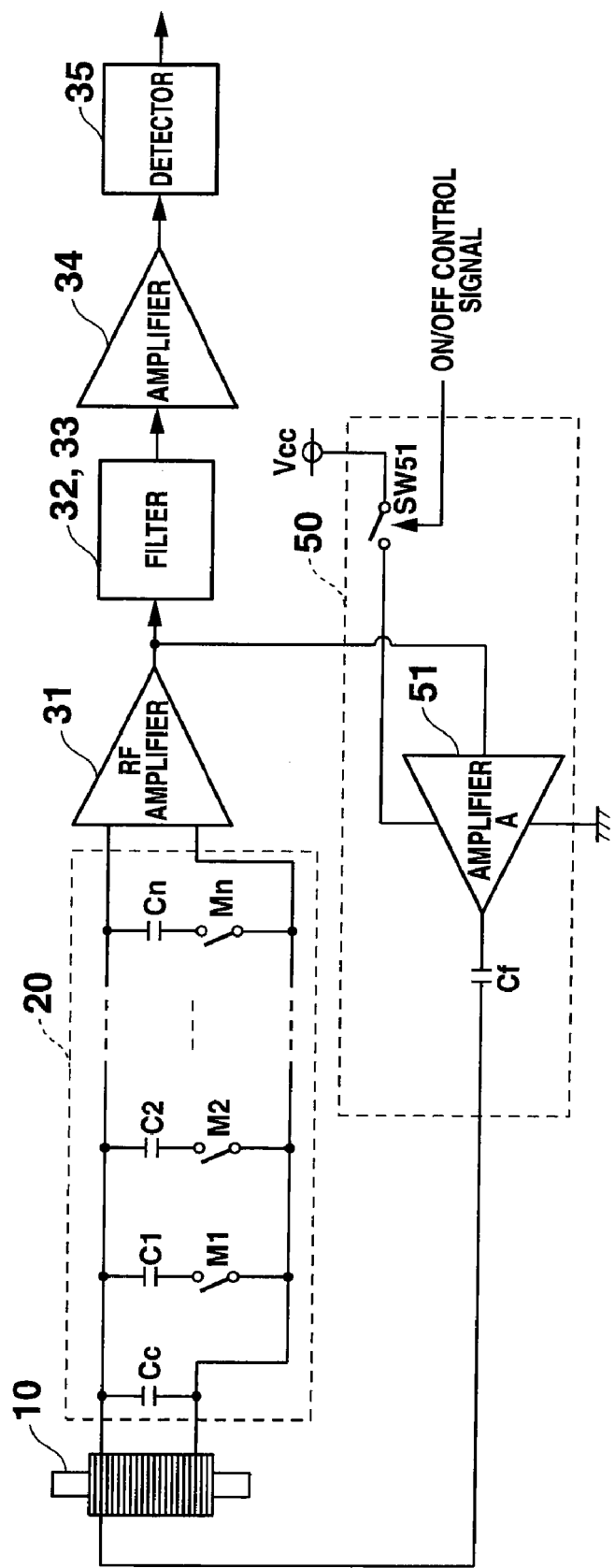
FIG. 4 is a configuration diagram showing a second variation of the feedback circuit where feedback destination is different.

FIG. 4 is a configuration diagram showing the second variation of the feedback circuit where feedback destination is different.

In the second variation, an input node for the feedback signal from the feedback circuit 50 is set in the middle of winding wire of the antenna 10. Also by such feedback path, similar to the above embodiment, the signal can oscillate at the frequency near the tuning frequency.

In addition, also in the case where the input node for the feedback signal is provided in the middle of the winding wire of the antenna 10, the feedback circuit 50A of the balanced type may be applied as shown in the first variation. In this case, it is preferable that the positive signal is fed back to a node near a terminal on a positive electrode side on the winding wire of the antenna 10 and the negative signal is fed back to a node near an terminal on a negative electrode side of the winding wire of the antenna 10.

[Third Variation]

Figure 5:
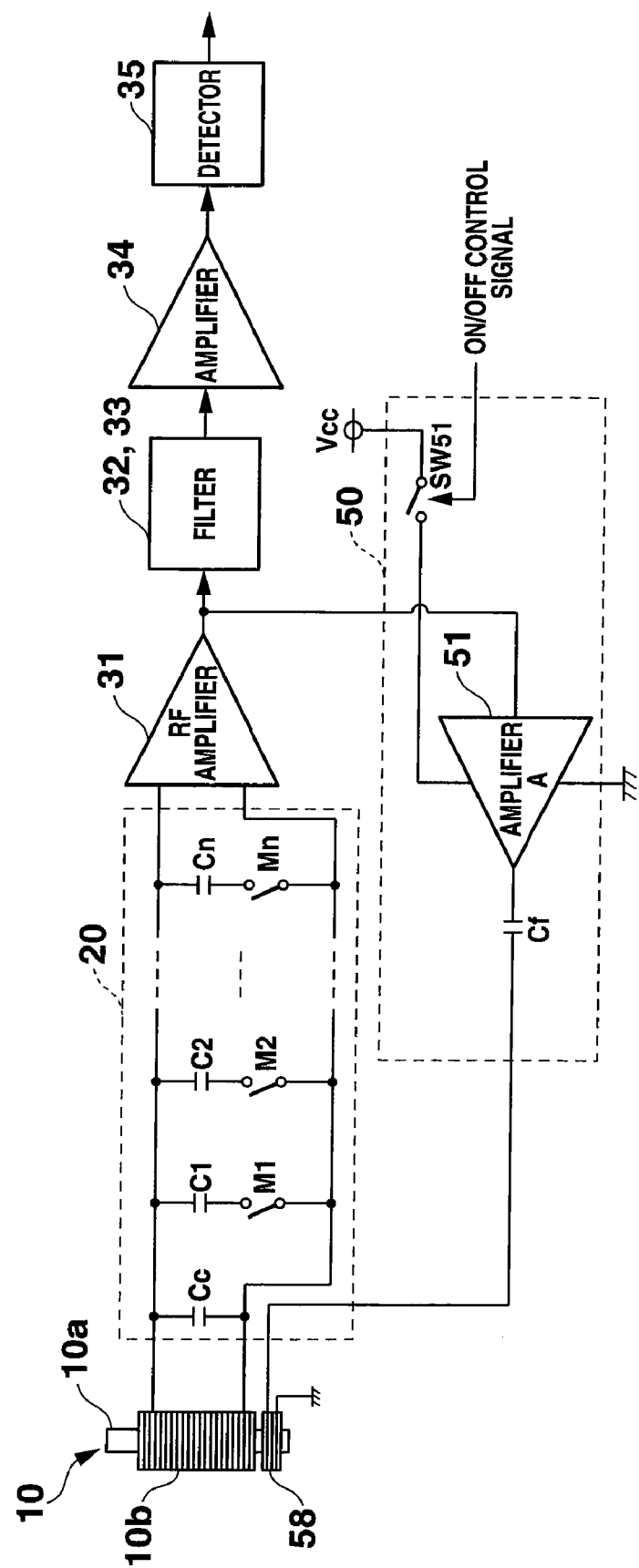
FIG. 5 is a configuration diagram showing a third variation of the feedback circuit where the feedback destination is different.

FIG. 5 shows a configuration diagram of the radio wave receiving apparatus showing the third variation of the feedback circuit where the feedback destination is different.

The third variation shows a configuration where the feedback signal from the feedback circuit 50 is fed back to the antenna 10 by an electromagnetic coupling. That is, there is shown the configuration where a secondary winding wire 58 is provided in a core 10a of the antenna 10 so that the feedback signal is output to the secondary winding wire 58, and thereby a signal from the secondary winding wire 58 is transmitted to a winding wire 1ob of the antenna 10 by the electromagnetic coupling.

Also by such feedback path, similar to the above embodiment, the signal can oscillate at the frequency near the tuning frequency.

Next, an automatic tuning processing executed by the CPU 40 of the above-described radio wave receiving apparatus 1 will be explained.

Figure 6:
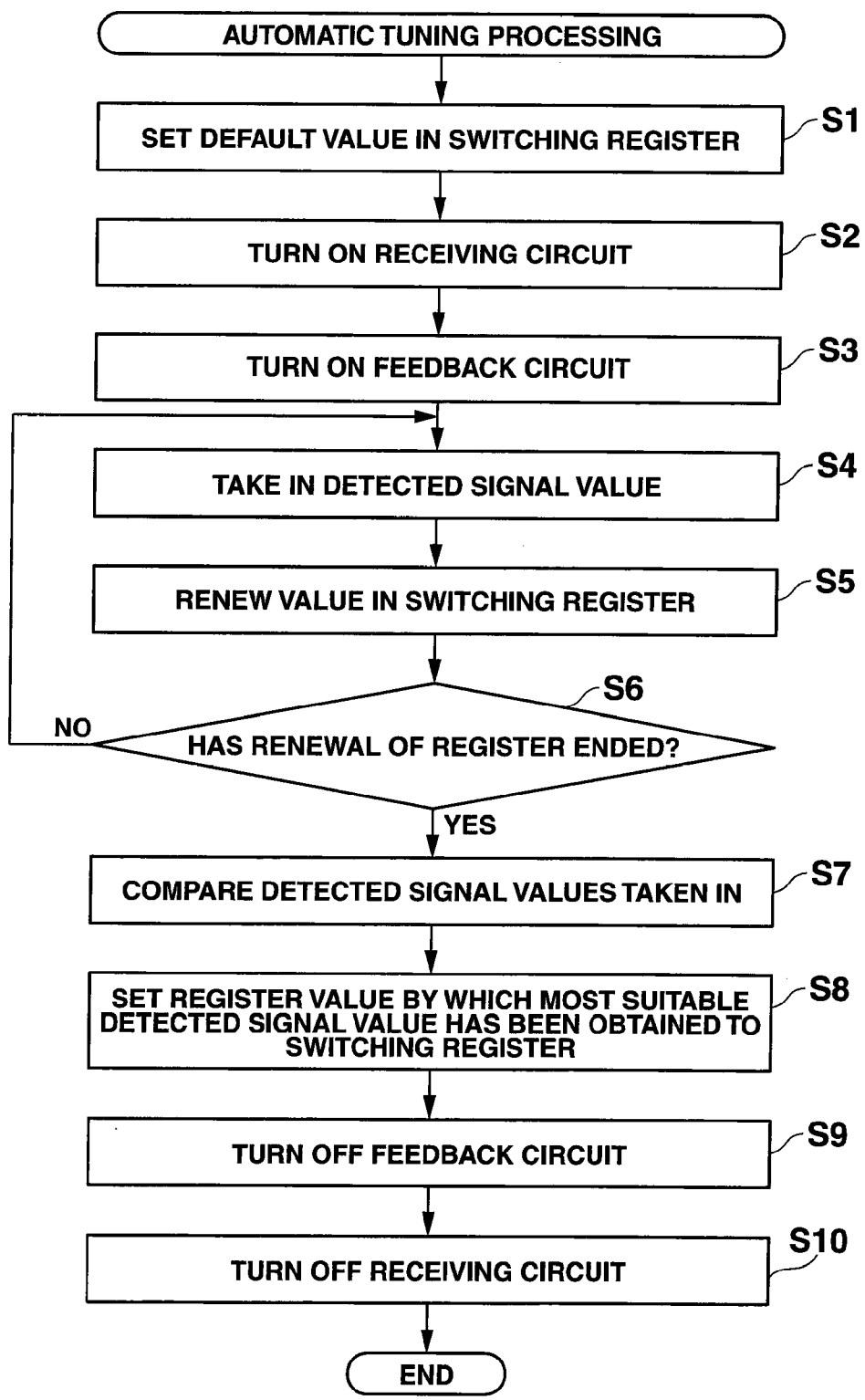
FIG. 6 is a flowchart showing a control procedure of automatic tuning processing performed by a CPU.

FIG. 6 is a flowchart showing a control procedure of the automatic tuning processing.

The automatic tuning processing starts, for example, during a factory default setting step, when the radio wave reception condition becomes poor for a certain period or more, or when there is a predetermined user-manipulated input. When the automatic tuning processing starts, the CPU40 firstly sets a default value in the switching register 42 (Step S1). By the operation, the switch elements M1-Mn of the tuning circuit 20 are turned into an initial switching pattern so that the setting of the tuning circuit 20 becomes an initial state.

Next, the CPU 40 turns on the reception circuit (the RF amplifier 31, the amplifier 34, the BPF 33, the detector 35, and the AGC circuit 36), and then turns on the feedback circuit 50 (Step S3). By the operation, the radio wave receiving apparatus 1 starts the receiving operation, and the signal is positively fed back in the signal path including the tuning circuit 20 through the feedback circuit 50 so that the signal oscillates at the almost same frequency as the tuning frequency.

The oscillation signal is transmitted through the low pass filter 32, the band pass filter 33, the amplifier 34 and the detector 35 to be processed, but when the oscillation frequency is out of the reception frequency, the signal passing through the low pass filter 32 and the band pass filter 33 gets smaller so that the detected output extremely falls. On the other hand, when the oscillation frequency overlaps the reception frequency, the signal passing through the low pass filter 32 and the band pass filter 33 gets larger so that the certain detected output can be obtained.

Here, the CPU 40 repeats loop processing of Steps S4-S6. In other words, the CPU 40 samples the output of the detector 35 to take in it through the AD converter (Step S4), renews the switching register 42 into a different value (Step S5), and confirms whether or not the switching register 42 has been renewed in all of different patterns (Step S6).

By repeating the loop processing of Steps S4-S6, the CPU 40 obtains sampling data of the detected signals in all of the connecting patterns of the capacitative elements C1-Cn of the tuning circuit 20. In other words, the CPU 40 obtains the sampling data from the time when the oscillation frequency ($\approx$ tuning frequency) is out of the reception frequency so that the detected output extremely falls to the time when the oscillation frequency overlaps the reception frequency so that the certain detected output can be obtained.

When such sampling data are obtained, then these sampling data are compared with each other to extract the sampling data when the reception status is good and the value of the switching register 42 at that time (Step S7). Then, the switching register 42 is set with the value at the time when it is judged that the reception status is good (Step S8). By the operation, the tuning frequency of the tuning circuit 20 is corrected to be in good condition at the time when overlapping the reception frequency.

After that, when setting of the tuning circuit 20 ends, the CPU 40 turns off the feedback circuit 50 and the reception circuit (Steps S9, S10) and ends the automatic tuning processing.

As described above, according to the radio wave receiving apparatus 1 of the above-described embodiment, by allowing the feedback circuit 50 (50A) to on-operate, the positive feedback is performed in the signal path including the tuning circuit 20 so that the signal can oscillate at the frequency almost same as the tuning frequency. Moreover, by processing the oscillation signal in the reception circuits (31-35), the certain detected output or AGC voltage is output when the tuning frequency overlaps the reception frequency, and the detected output extremely falls and the AGC voltage rises to a saturated level when the tuning frequency is out of the reception frequency.

Therefore, according to the above-described automatic tuning processing, by changing the frequency characteristics of the tuning circuit 20 while monitoring the detected output to identify the setting when the reception status is good, the tuning circuit 20 can be corrected into characteristics adapting to the reception frequency band.

Moreover, compared to the case of providing the oscillation circuit for oscillating at an accurate frequency, in order to execute such automatic tuning processing, the number of circuits to be added can be small and external components need not to be added for integrating the circuits.

Moreover, when the tuning processing is not executed, by turning off the feedback circuit 50, the oscillation through the feedback circuit 50 stops so that the radio wave receiving processing can be ordinary performed.

Moreover, because the feedback circuit 50 has the configuration which receives the output of the RF amplifier 31 to be fed back, the oscillation can effectively occur.

Moreover, because the feedback circuit 50 is composed of the amplifier circuit (non-inverting amplifiers 51, 53 and inverting amplifier 54) which amplifies the feedback signal and the impedance element (coupling capacitors Cf, Cf1, Cf2) which attenuates the amplified signal to transmit it, by switching the amplifier circuit to the operating/non-operating status, the feedback operation can be reliably switched to it's on/off status. In addition, the feedback circuit 50 can be configured so as not to have an affect on the reception operation when the feedback operation is turned off.

Furthermore, by the variation of the feedback circuit shown in FIGS. 3-5, the feedback circuit 50 can be adapted for the balanced type antenna or tuning circuit, or the signal can oscillate at the frequency nearer the tuning frequency determined depending on the characteristics of the antenna 10 and the tuning circuit 20.

Incidentally, the present invention is not limited to the above-described embodiment, and various changes can be mode to the present invention. For example, although the configuration where the impedance element coupled to the feedback destination at low coupling degree to transmit the feedback signal, and the amplifying member to amplify the feedback signal, are combined is shown as the feedback circuit 50, for example, a configuration where the output terminal of the RF amplifier 31 and the signal line of the antenna 10 or the tuning circuit 20 are directly connected through signal lines may be adopted. In this case, it is also possible to switch executing/stopping of the signal line by providing a switch element at the signal line for feedback to allow the configuration to be capable of connecting/cutting-off the signal line.

Moreover, though the configuration where the output of the RF amplifier 31 is fed back, the configuration is not limited to above, and the signal in an input stage of the RF amplifier may be fed back as long as the feedback circuit 50 is equipped with the amplifier. In addition, when frequency conversion is not performed in the middle of the reception circuit, the output of the filter circuits (32, 33) or the amplifier 34 of the second stage may be fed back.

Moreover, also the method for judging right and wrong of the reception status is not limited to the method by which the detected signal or the AGC voltage is digitally sampled to be processed, and various methods may be adopted such as judging that the reception status is good when the signal higher than the threshold value is obtained by an analog comparator.

Moreover, though the configuration where the CPU 40 automatically adjusts the tuning circuit 20 is shown in the embodiment, a configuration where the adjustment of the tuning circuit 40 is manually performed may be adopted.

Moreover, the configurations of the radio wave receiving apparatus 1 and the tuning circuit 20 are explained as the configuration to receive the radio wave of only one channel of 60 kHz, a configuration capable of deal with a plurality of channels, for example, by switching the capacitance value of the tuning circuit 20 to switch the reception signal to the tuning frequency corresponding to each of a plurality of channels, by preparing the filter circuits 32, 33 available for the plurality of channels in the reception circuit to switch the reception signal, or in the case of the reception circuit of superheterodyne system, by converting the reception signals of the plurality of channels into an intermediate frequency. Also for the reception of the plurality of the channels, the present invention can be applied as the configuration which performs the tuning processing for each channel.

Furthermore, though the example in which the present invention is applied to the reception circuit of straight type is shown in the above-described embodiment, it also possible to apply the present invention to a superheterodyne type reception circuit which converts the reception signal into the intermediate frequency in the middle of the reception circuit, or to a direct-conversion type reception circuit. In the case of the superheterodyne type, the signal of the intermediate frequency becomes the signal within the frequency band including a modulation wave extracted by the filtering member.

In addition, the details shown in the embodiment such as a type of reception radio wave, configurations of the antenna and the tuning circuit, and each processing of the automatic tuning processing may be arbitrarily changed without departing from the scope of the present invention.

Second Embodiment

Figure 7:
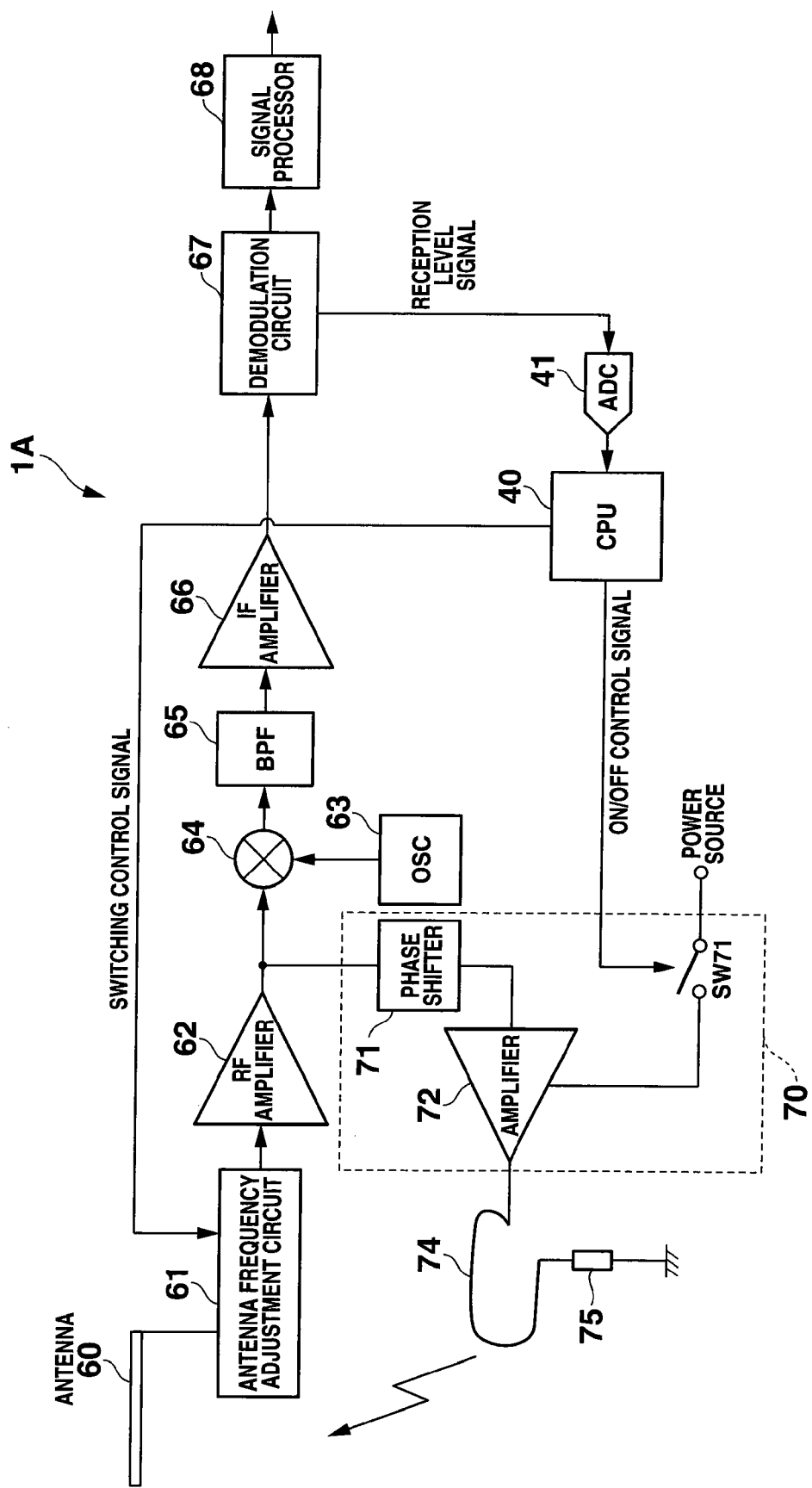
FIG. 7 is a configuration diagram showing a whole radio wave receiving apparatus according to a second embodiment of the present invention.

FIG. 7 shows a configuration diagram showing a whole radio wave receiving apparatus 1A according to the second embodiment of the present invention.

The radio wave receiving apparatus 1A of the second embodiment is, for example, an apparatus mounted to a cellular phone and the like and receiving a radio wave signal of high frequency, which is configured to be capable of performing self-oscillation to automatically adjust a frequency characteristic of the antenna.

As shown in FIG. 7, the radio wave receiving apparatus 1A includes: an antenna 60 to receive the radio wave; an antenna frequency adjustment circuit 61 to adjust the frequency characteristic of the antenna 60; an RF amplifier 62 such as a Low Noise Amplifier (LNA) to amplify the reception signal; a frequency converter 64 (for example, mixer) to convert the reception signal to the intermediate frequency; an oscillator 63 to supply a local signal to the frequency converter 64; a band path filter 65 to allow a signal within the previously set intermediate frequency band to pass through, and to attenuate a signal of other frequencies; an IF amplifier 66 to amplify the signal of the intermediate frequency; a demodulation circuit 67 to perform demodulating processing of the reception signal; a signal processor 68 to perform various signal processing to the demodulated signal, and so on. Among these, the RF amplifier 62, the frequency converter 64, the oscillator 63, the band pass filter 65, the IF amplifier 66, the demodulation circuit 67, the signal processor 68 constitute the receiving member which extracts information signal from the reception signal.

The radio wave receiving apparatus 1A further includes: a feedback circuit 70 to feed back the reception signal output from the antenna 60 for automatically adjusting the antenna characteristic; a radiating antenna 74 to radiate the reception signal fed back from the feedback circuit 70 as the radio wave; a Central Processing Unit (CPU) 40 to perform automatic adjustment control of the antenna characteristic, and so on.

The feedback circuit 70 includes a phase shifter 71 to shift a phase of the feedback signal, and an amplifier 72 to amplify the feedback signal. In the embodiment, an input terminal of the feedback circuit 70 is connected to an output terminal of the RF amplifier 62, but not limited to this configuration. In addition, the feedback circuit 70 may have a configuration where an input terminal is connected to the precedent stage of the RF amplifier 62 in order to input a signal which has not been amplified by the RF amplifier 62 as the feedback signal, for example, as long as the feedback circuit 70 can receive the reception signal before frequency conversion.

The phase shifter 71 shifts a phase of the feedback signal in order to perform oscillation by the feedback of the signal in loop path. The phase shifter 71 may be omitted when the oscillation can be obtained without the phase shift.

The feedback circuit 70 is further equipped with a switch SW71 capable of turning on/off power supply to the amplifier 72. By the configuration, the status of the switch SW71 can be switched according to ON/OFF signal from the CPU 40.

As the radiating antenna 74, for example, in addition to a small dipole antenna, monopole antenna, and helical antenna and the like, an antenna where a conductor is formed in pattern on a substrate and an antenna downsized and multi-layered by a technique of Wafer Level Package (WLP) may be applied. The frequency characteristic of the radiating antenna 74 is preferably flat within the frequency band of the oscillation signal. One of the terminals of the radiating antenna 74 may be open or connected to an impedance element 75 suitable for reducing reflection and the like, for example.

The CPU 40 is, for example, capable of monitoring the reception level by receiving an input of a reception level signal representing the reception level from the demodulation circuit 67 through the AD converter 41. The CPU 40 is also capable of switching the feedback circuit 70 between the operating status and the non-operating status by the output of the ON/OFF control signal, and changing the setting of the antenna frequency adjustment circuit 61 by the output of the switching control signal.

Figure 8:
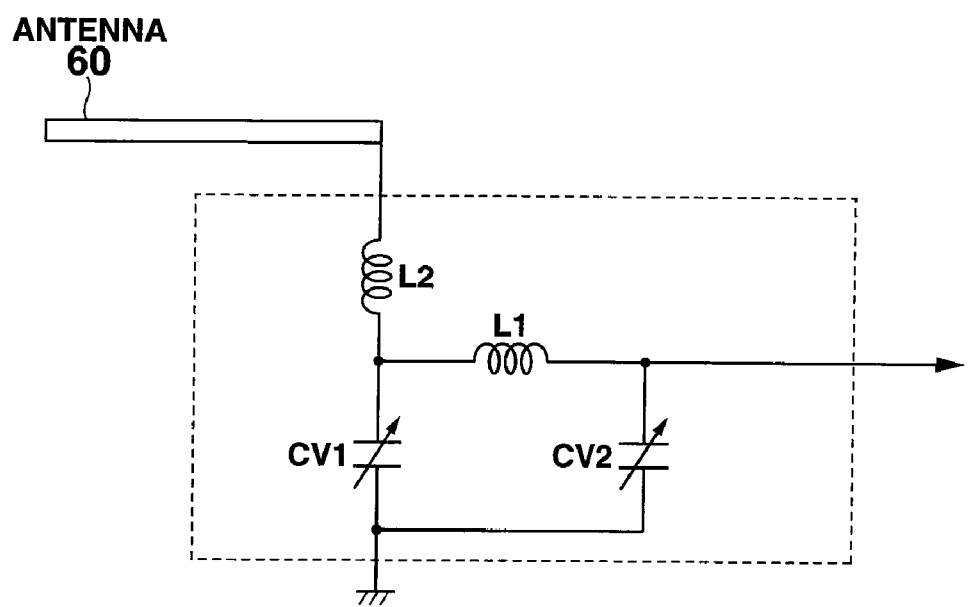
FIG. 8 is an example of details of an antenna frequency adjustment circuit.

FIG. 8 shows a configuration diagram showing an example of details of the antenna frequency adjustment circuit 61.

The antenna frequency adjustment circuit 61 has a configuration where inductances L1, L2 and variable capacities CV1, CV2 are connected to a path between the antenna 60 and the RF amplifier 62. As the variable capacities CV1, CV2, a configuration capable of sequentially changing capacity values like a varicap diode, a configuration capable of changing capacity values in a stepwise fashion by connecting or cutting a plurality of capacities via switch, or a configuration of combination thereof may be adopted, for example. Also as the inductances L1, L2, a configuration capable of changing inductance values by changing a connecting point thereof may be adopted.

According to such configuration, the antenna frequency adjustment circuit 61 may change the capacity values or the inductance values to change the oscillation frequency of the antenna 60, or to adjust an impedance of the antenna 60. Incidentally, the number of elements and connecting types of the inductances L1, L2 and the variable capacities CV1, CV2 may be changed arbitrarily, being not limited to the configuration shown in FIG. 8.

Figure 9:
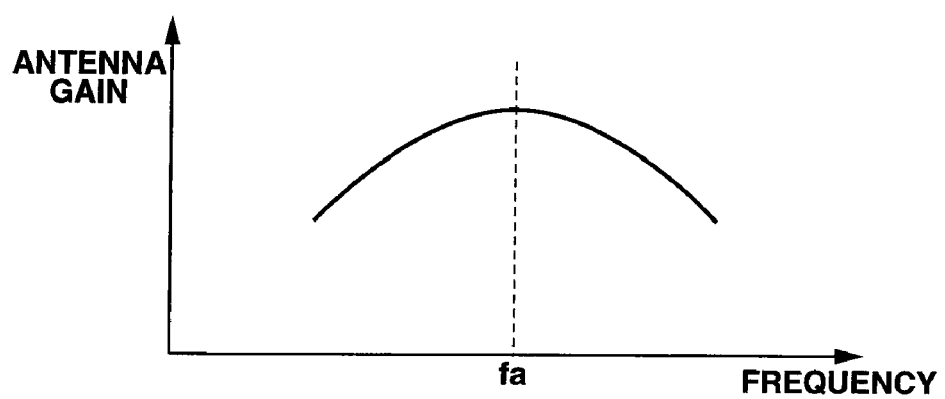
FIG. 9 is a diagram showing a frequency characteristics of an antenna gain.

FIG. 9 is a characteristic diagram showing the frequency characteristic of the antenna gain in the antenna 60.

The antenna 60 is, for example, small monopole antenna, dipole antenna and helical antenna, but not especially limited to those. As shown in FIG. 9, the frequency characteristic of the antenna 60 is such that the gain reaches its peak at the oscillation frequency fa, and the more the frequency of the reception signal gets away from the oscillation frequency fa, the more the antenna gain reduces.

[Explanation of Operation]

The radio wave receiving apparatus 1A having the above configuration automatically adjusts the frequency characteristic of the antenna 60 to perform an operation of receiving the radio wave as described below.

Figure 10:
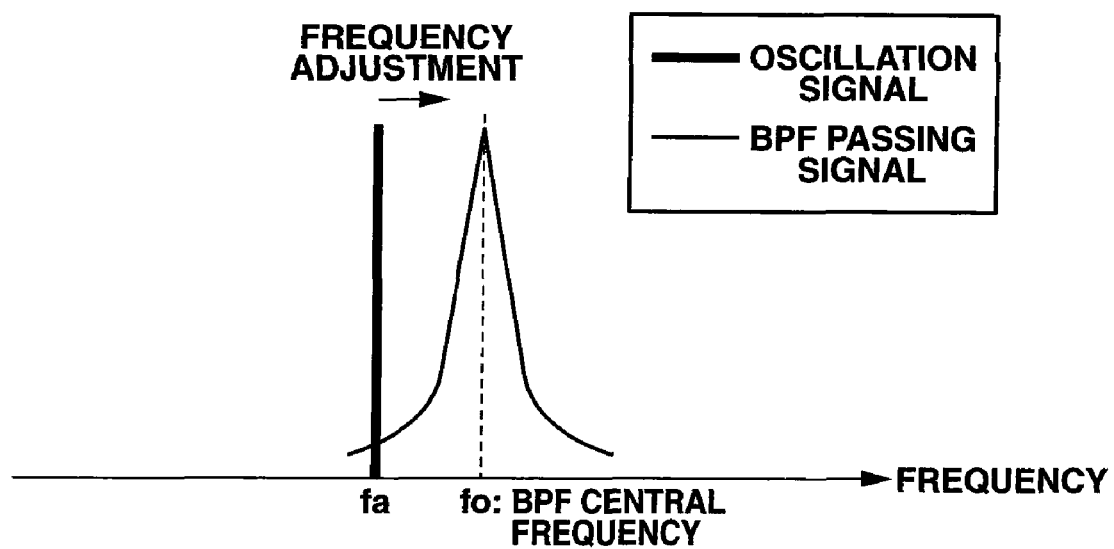
FIG. 10 is a diagram for explaining an overview of adjusting processing of the antenna frequency characteristics.

FIG. 10 shows a diagram for explaining an overview of adjusting processing of the antenna frequency characteristic.

For example, when the communication band is changed by multi-band communication, when switching (for example, switching from a communication with a communication base station to a near field communication with peripherals) of the communication mode is performed, when a processing command for antenna adjustment is input in the factory, when the reception level of wireless signal falls during normal use or the like, the CPU 40 makes the shift to the adjusting processing of the antenna characteristic at these timings.

When shifting to the adjusting processing of the antenna characteristic, the CPU 40 firstly turns on the switch SW71 of the feedback circuit 70 to allow the feedback circuit 70 to be the operating status. Then, the feedback circuit 70 transmits the signal to the radiating antenna 74 to perform field emission, and the antenna 60 receives the emission. Thus, the radiating antenna 74 and the antenna 60 are coupled to each other through the field emission. After that, by the loop path composed of the antenna 60, antenna frequency adjustment circuit 61, the RF amplifier 62, the phase shifter 71, the amplifier 72 and the radiating antenna 74, the gain of the loop path becomes 1 (one) or more and the phases of the signals are properly allowed to be overlapped with each other by the phase shifter 71 and the like so that oscillation operation occurs.

As shown in FIG. 10, the frequency of the oscillation signal obtained by the oscillation operation substantially corresponds to the oscillation frequency fa of the antenna 60. The oscillation signal of the oscillation frequency fa is output from the RF amplifier 62 to be frequency-converted in the frequency converter 64 to be sent to the band pass filter 65.

A pass characteristic of the band pass filter 65 is, as shown in a characteristic line of BPS passing signal in FIG. 10, a characteristic which allows the signal within narrow band around a central frequency fo thereof, and drastically reduces the signals of other frequencies. Since the embodiment adopts the configuration where the signal frequency-converted in the frequency converter 64 passes through the band pass filter 65, the central frequency fo shown in FIG. 10 is not an actual central frequency of the band pass filter 65, but represents the frequency of the signal which has not converted in the frequency converter 64. In other words, the frequency obtained by frequency-converting the signal of the central frequency fo of FIG. 10 in the frequency converter 64 is the actual central frequency of the band pass filter 65.

Therefore, as shown in FIG. 10, when the oscillation frequency fa of the antenna 60 is getting away from the central frequency fo passing through the band pass filter 65, the oscillation frequency fa is reduced by the band pass filter 65 so that the signal level of the reception signal to be sent to the IF amplifier 66 and the demodulation circuit 67 becomes low.

In the adjusting processing of the antenna characteristic, for example, the CPU 40 monitors the signal level (hereinafter referred to as a reception level) of the reception signal by receiving the input of the reception level signal sent from the demodulation circuit 67 through the AD converter 41.

When the CPU 40 judges that the reception level is low, the CPU 40 transmits the switching control signal to the antenna frequency adjustment circuit 61 to change the setting status thereof. If the oscillation frequency fa of the antenna 60 approaches the central frequency fo of the band pass filter 65 by this setting change, it is judged that the reception level has been raised by the CPU 40. By repeating the setting change of the antenna frequency adjustment circuit 61 by the CPU 40, most suitable setting status in which the oscillation frequency fa becomes near to the central frequency fo can be found out.

After above-described adjustment of the oscillation frequency fa, or while this adjustment, the impedance of the antenna 60 is adjusted by the setting change processing of the antenna frequency adjustment circuit 61 by the CPU 40. According to this impedance adjustment, for example, an impedance matching of the antenna 60 is performed so that the reflection of the reception signal and the like disappears and the reception level rises. By this adjustment, the CPU 40 can also find out most suitable setting status of the impedance characteristic of the antenna 60.

When the reception level rises by adjusting the antenna frequency adjustment circuit 61 as described above, the CPU 40 turns off the switch SW71 of the feedback circuit 70 to stop the feedback operation. By this operation, the adjusting processing of the antenna frequency characteristic ends. In a subsequent receiving processing, the signal can be received with high sensitivity because the frequency characteristic of the antenna 60 has been improved.

As described above, according to the radio wave receiving apparatus 1A of the second embodiment, since the signal is fed back by field emission through the radiating antenna 74 to cause oscillation operation, even in a circuit which receives a signal of high frequency of 10 MHz or more, or 1 GHz or more, the oscillation operation can appropriately occur to create the oscillation signal necessary for the automatic adjusting processing.

Moreover, since the antenna frequency adjustment circuit 61 has the configuration capable of adjusting the oscillation frequency and the impedance of the antenna 60, the reception characteristic of the antenna 60 for high frequency signal can be appropriately optimized.

Furthermore, since the feedback circuit 70 is equipped with the amplifier 72, even if field emission from the radiating antenna 74 is weak, the gain of the loop path can be 1 (one) or more so as to cause the oscillation operation. In addition, since the feedback circuit 70 is equipped with the phase shifter 71, also the phase of the high frequency signal can be appropriately shifted to cause the oscillation operation. Incidentally, in the case of the configuration where the frequency of the reception signal drastically changes, a configuration where the phase shift amount of the phase shifter 71 can be set to a plurality of stages so as to obtain most suitable phase shift amount for each frequency band. The CPU 40 may switch the setting of the phase shifter 71 according to each frequency band.

Moreover, by applying an antenna in which a conductor is formed in pattern on a substrate or an antenna using WLP technique as the radiating antenna 74, an occupied volume of whole circuit can be minimized even when the radio receiving apparatus 1A is mounted in a small apparatus.

Furthermore, since the CPU 40 performs the setting change of the antenna frequency adjustment circuit 61 while monitoring the reception level of the reception signal, it becomes possible to set the antenna characteristic to improve an actual reception level of the reception signal. In addition, though the embodiment shows the configuration which outputs the reception level signal from inside of the demodulation circuit 67 to the CPU 40 as an example, the reception level signal can be appropriately changed to be created from the signal which has passed through the band pass filter 65 or the output of the IF amplifier 66, or created from the AGC signal of the IF amplifier 66, for example.

Incidentally, the present invention is not limited to the above second embodiment. For example, though the radio wave receiving apparatus 1A of the second embodiment adopts the receiving circuit of superheterodyne system, also the receiving circuit of direct conversion system may be adopted. Other configurations including details shown in the embodiment may be arbitrarily changed without departing from the scope of the present invention.

What is claimed is:

1. A radio wave receiving apparatus comprising:
   an antenna to receive a radio wave;
   a tuning member to tune a reception frequency of the antenna to an intended frequency, wherein a frequency characteristic of the tuning member is variable;
   a receiving member to receive a reception signal from the antenna to demodulate a modulation wave, the receiving member including an RF amplifier to amplify the reception signal from the antenna;
   a positive feedback member; and
   a switching member to turn on/off a feedback operation of the positive feedback member;
   wherein the positive feedback member comprises:
      a feedback signal amplifying member to receive and amplify an output signal of the RF amplifier; and
      an impedance element coupled to an output of the feedback signal amplifying member and the tuning member, wherein the impedance element attenuates an output signal of the feedback signal amplifying member, and transmits the attenuated signal to the turning member.

2. The radio wave receiving apparatus according to claim 1, further comprising:
   a control member which is capable of switching the frequency characteristic of the tuning member,
   wherein the control member switches the frequency characteristic of the tuning member in a state that the positive feedback member is turned on and can cause oscillation, and compares signals in the receiving member to perform correction processing of the tuning member.

3. The radio wave receiving apparatus according to claim 1, wherein the antenna is a coil antenna, and the tuning member is connected to the coil antenna and includes a variable capacity member in which a capacity is variable.

4. The radio wave receiving apparatus according to claim 1, wherein the receiving member includes a filter member to extract a signal within a predetermined frequency band including the modulation wave from the reception signal.

5. The radio wave receiving apparatus according to claim 1, wherein the output signal of the feedback signal amplifying member that is attenuated by the impedance element is transmitted to a first terminal of the antenna; and
  wherein the positive feedback member further comprises:
    another feedback signal amplifying member to receive and amplify the output signal of the RF amplifier and to reverse a polarity of the amplified signal; and
    another impedance element coupled to an output of said another feedback signal amplifying member and the tuning member, wherein the impedance element attenuates the reversed-polarity signal output from said another feedback signal amplifying member, and transmits the attenuated reversed-polarity signal to a second terminal of the tuning member.

6. The radio wave receiving apparatus according to claim 1, wherein the positive feedback member feeds back the output signal of the feedback signal amplifying member that is attenuated by the impedance element to a signal line of the tuning member.

* * * * *